(12) United States Patent
Vijayaraghavan et al.

(10) Patent No.: US 8,984,380 B2
(45) Date of Patent: Mar. 17, 2015

(54) METHOD AND SYSTEM FOR OPERATING A COMMUNICATION CIRCUIT CONFIGURABLE TO SUPPORT ONE OR MORE DATA RATES

(71) Applicant: ALTERA Corporation, San Jose, CA (US)

(72) Inventors: Divya Vijayaraghavan, Los Altos, CA (US); Chong H. Lee, San Ramon, CA (US); Keith Duwel, San Jose, CA (US); Vinson Chan, San Jose, CA (US)

(73) Assignee: ALTERA Corporation, San Jose, CA (US)

( * ) Notice: Subject to any disclaimer, the term of this patent is extended or adjusted under 35 U.S.C. 154(b) by 0 days.

(21) Appl. No.: 13/733,798

(22) Filed: Jan. 3, 2013

(65) Prior Publication Data

US 2014/0189459 A1    Jul. 3, 2014

Related U.S. Application Data

(60) Provisional application No. 61/632,420, filed on Jan. 3, 2012.

(51) Int. Cl.
*H03M 13/00* (2006.01)
*H03M 13/35* (2006.01)
*H03M 13/37* (2006.01)
*H04L 12/931* (2013.01)
*H03M 13/07* (2006.01)

(52) U.S. Cl.
CPC ........... *H03M 13/353* (2013.01); *H04L 49/604* (2013.01); *H03M 13/07* (2013.01); *H03M 13/63* (2013.01); *H03M 13/3738* (2013.01); *H03M 13/6511* (2013.01); *H03M 13/6516* (2013.01); *H03M 13/6519* (2013.01)
USPC ........................... 714/776; 370/445; 370/543

(58) Field of Classification Search
CPC ... H04L 49/604; H04L 2209/34; H04L 1/004; H04L 1/0057; H03M 13/07; H03M 13/63
USPC .................................. 714/776; 370/445, 543
See application file for complete search history.

(56) References Cited

U.S. PATENT DOCUMENTS

| 8,352,828 | B2 * | 1/2013 | Ganga et al. | 714/752 |
| 2005/0005189 | A1 * | 1/2005 | Khermosh et al. | 714/4 |
| 2013/0305127 | A1 * | 11/2013 | Kim et al. | 714/785 |
| 2014/0019827 | A1 * | 1/2014 | Ganga et al. | 714/776 |
| 2014/0075076 | A1 * | 3/2014 | Pillai et al. | 710/305 |

OTHER PUBLICATIONS

IEEE, "Ethernet Standard" (802.3), 2012, IEEE Standards publication.*

* cited by examiner

*Primary Examiner* — John P Trimmings

(57) ABSTRACT

A method and system for operating a communication circuit that is configurable to support one or more communication standards on a single device. The communication circuit includes a transmitting device that comprises a PCS module operating at a first data rate, and a second PCS module operating at a second data rate. The circuit also includes a plurality of forward error correction (FEC) encoding and decoding modules, each operating at a specified data rate. A first group of FEC encoding and decoding modules is configured to support the first PCS module, and a second group of FEC encoding and decoding modules is configured to support the second PCS module.

15 Claims, 10 Drawing Sheets

METHOD AND SYSTEM FOR OPERATING A COMMUNICATION CIRCUIT CONFIGURABLE TO SUPPORT ONE OR MORE DATA RATES

CROSS REFERENCE TO RELATED APPLICATIONS

The present application claims priority to and the benefit of the commonly owned, provisional patent application, U.S. Ser. No. 61/632,420, entitled "METHOD AND SYSTEM FOR OPERATING A COMMUNICATION CIRCUIT CONFIGURABLE TO SUPPORT ONE OR MORE DATA RATES," with filing date Jan. 3, 2012, which is herein incorporated by reference in its entirety.

The present application is related to U.S. patent application Ser. No. 13/175,740, filed Jul. 1, 2011, entitled "METHOD AND SYSTEM FOR OPERATING A COMMUNICATION CIRCUIT DURING A LOW-POWER STATE," naming Divya Vijayaraghavan and Chong Lee as inventors. That application is incorporated herein by reference in its entirety and for all purposes.

The present application is related to U.S. patent application Ser. No. 13/175,745, filed Jul. 1, 2011, entitled "METHOD AND SYSTEM FOR EFFICIENTLY TRANSITIONING A COMMUNICATION CIRCUIT FROM A LOW-POWER STATE," naming Divya Vijayaraghavan and Chong Lee as inventors. That application is incorporated herein by reference in its entirety and for all purposes.

The present application is related to U.S. patent application Ser. No. 13/175,749, filed Jul. 1, 2011, entitled "METHOD AND SYSTEM FOR TRANSITIONING A COMMUNICATION CIRCUIT TO A LOW-POWER STATE," naming Divya Vijayaraghavan and Chong Lee as inventors. That application is incorporated herein by reference in its entirety and for all purposes.

BACKGROUND OF THE INVENTION

Ethernet networks are commonly used to exchange data. For example, computer systems may be coupled via Ethernet links, where the links may include twisted-pair cabling or some other communication medium. As another example, Ethernet links may be implemented in the backplane of a system that includes one or more different types of devices such as computer blades, line cards, switch cards, etc. The electronic devices may communicate over one or more communication links within the backplane of the system.

Ethernet standards are migrating to higher data rates and bandwidths. For instance, the 40 GbE (Gigabit Ethernet) standard provides for higher communication data rates (e.g., 40 gigabits per second) than the previous 10 GbE standard. Even higher bandwidths and data rates are contemplated. Telecommunication equipment manufacturers are focusing on developing the next generating of bridging applications and switching solutions for these emerging Ethernet standards.

Potentially, multiple Ethernet standards may become operational at the same time. As such, users are provided with a wide range of data rates and bandwidths to satisfy their communication needs. Equipment manufacturers would like to minimize their efforts when designing equipment supporting the new data rates.

SUMMARY OF THE INVENTION

Accordingly, a need exists for systems that are configurable to support multiple Ethernet standards when supporting communication over a communication link, particularly using communication circuitry implemented using one or more programmable logic devices (PLDs) such as, field-programmable gate arrays (FPGAs).

Embodiments of the present invention are directed to a method and system for operating a communication circuit that is configurable to support one or more communication standards on a single device. More specifically, data may be transmitted over a communication link (e.g., an Ethernet link, a link that operates in accordance with another communication standard, etc.) from a first device (e.g., a PLD such as an FPGA) to a second device, wherein the first device is configurable to support multiple communication standards (e.g., 10 GbE or 40 GbE, etc.).

In one embodiment, a method for operating a communication circuit includes sending data from a transmitting device, wherein the transmitting device is configurable to support multiple data rates associated with multiple communication standards. Specifically, the transmitting device includes a physical coding sublayer (PCS) module that provides a stream of information arranged in packets at a first data rate. This first data rate is in compliance with a selected communication standard. The stream of information is striped into one or more substreams of information delivered over one or more channels or lanes. Each of the channels operate at a second data rate equal to or lower than the first data rate. For each substream of information, the PCS module periodically adds an alignment marker. Forward error correction (FEC) is performed on each substream, wherein one or more FEC encoding modules of a plurality of FEC encoding modules are configured to support the first PCS module. Each of the plurality of FEC modules operate at approximately the second data rate. Additionally, one or more FEC encoding modules are configurable to support a second PCS module that operates at a third data rate that is greater than the second data rate. In that manner, the first device is configurable to support multiple communication standards.

In another embodiment, a circuit for providing communication is disclosed and includes a transmitting device that is configurable to support multiple communication standards. In particular, the transmitting device includes a first PCS module that operates at a first data rate that is in compliance with a first communication standard. The transmitting device includes a second PCS module that operates at a second data rate that is in compliance with a second communication standard. Further, a plurality of FEC encoding modules are included, wherein each encoding module operates at a specified data rate. More particularly, one or more FEC encoding modules of the plurality of FEC encoding module are configurable to support the first and second PCS modules. That is, one or more FEC encoding modules are selectable as a first group of FEC encoding modules configured to support the first PCS module. Also, one or more FEC encoding modules are selectable as a second group of FEC encoding modules configured to support the second PCS module. FEC encoding modules are selectable to support either of the first or second PCS modules, such that one or more FEC encoding modules are configurable to support either of the first or second PCS modules.

In still another embodiment, a circuit for providing communication is disclosed and includes a receiving device that is configurable to support multiple communication standards. In particular, the receiving device receives packets of information over one or more channels, wherein the channel configuration corresponds to a selected first or second PCS module from a transmitting device. More particularly, the first PCS module operates at a first data rate of approximately 10 gigabits per second (gbps), and wherein the second PCS module operates at a second data rate of approximately 40 gbps. The first PCS module is in compliance with the 10 GbE communication standard, and the second PCS module is in compliance with the 40 GbE communication standard. Also, the receiving device comprises a plurality of FEC decoding modules, each of which operates at a specified data rate of approximately 10 gigabits per second. One or more FEC decoding modules are configurable to receive the packets of information from the one or more FEC encoding modules over the one or more channels.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Figure 1:
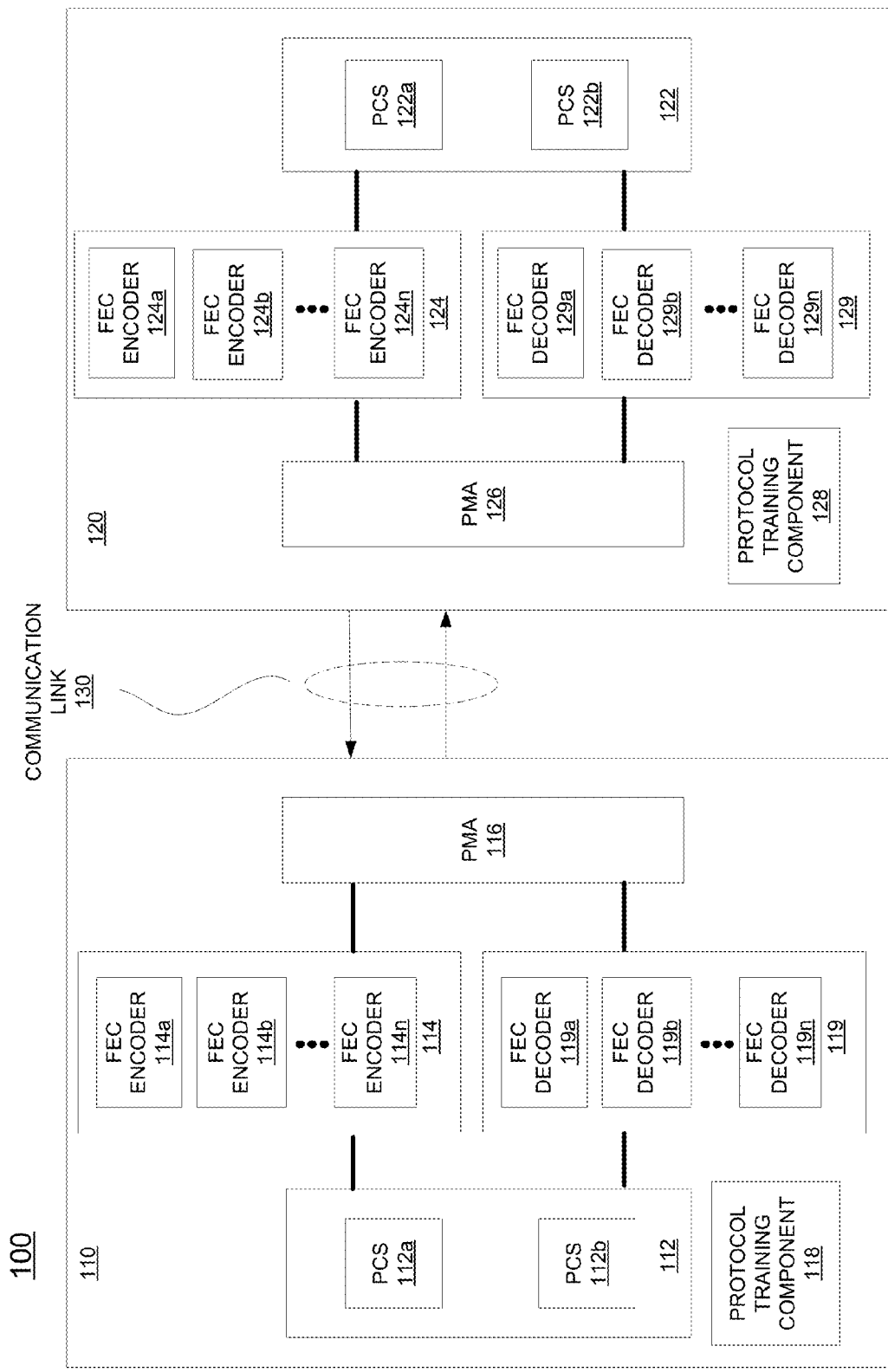
FIG. 1 shows exemplary system 100 for enabling devices to communicate over a communication link in accordance with one embodiment of the present invention.

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Accordingly, embodiments of the present invention provide for operating a communication circuit that is configurable to support one or more communication standards on a single device. In particular, PLDs (e.g., FPGAs) have the bandwidth, high transceiver count, and ability to support multiple communication standards on a single device. As such, embodiments of the present invention are able to consolidate the use of components within a configurable device to support multiple communication interface standards, such as, Ethernet interfaces at 10 Gbps and beyond. For instance, embodiments of the present invention are capable of providing bridging and switching solutions for one or more Ethernet standards (e.g., 10 GbE, 40 GbE, etc.) using FPGA devices. That is, data may be transmitted over a communication link (e.g., an Ethernet link, a link that operates in accordance with another communication standard, etc.) from a first device (e.g., a PLD, such as an FPGA) to a second device, wherein the first device is configurable to support multiple communication standards (e.g., 10 GbE or 40 GbE).

Notation and Nomenclature

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "accessing," "receiving," "sending," "broadcasting," "determining," "generating," "signaling," "calculating," or the like, refer to actions and processes of a circuit, an integrated circuit, a computer system, or similar electronic computing device or processor. The circuit, computer system, or similar electronic computing device manipulates and transforms data represented as physical (electronic) quantities within memory systems, registers or other such information storage, transmission or display devices.

Embodiments of the Present Invention

FIG. 1 shows exemplary system 100 for enabling devices to communicate over a communication link in accordance with one embodiment of the present invention. As shown in FIG. 1, device 110 and device 120 may communicate over communication link 130. As such, communication link 130 may provide a communication path for one or more devices (e.g., device 110, device 120, etc.). Communication link 130 may be an Ethernet link, a link that operates in accordance with another communication standard (e.g., PCI-Express, USB, eSATA, etc.), etc.

As shown in FIG. 1, device 110 and/or device 120 may include a plurality of components enabling data sent and/or received over communication link 130. For example, device 110 may include physical coding sublayer (PCS) 112, forward error correction (FEC) encoder 114, FEC decoder 119, physical medium attachment (PMA) 116 and protocol training component 118. As another example, device 120 may include physical coding sublayer (PCS) 122, forward error correction (FEC) encoder 124, FEC decoder 129, physical medium attachment (PMA) 126 and protocol training component 128. In one embodiment, device 110 and/or device 120 may be implemented using one or more PLDs, such as, FPGAs, or the like, where one or more components of device 110 and/or device 120 may be implemented in accordance with PLD 1000 of FIG. 10 in one embodiment. Alternatively, devices 110 and 120 may be implemented using one or more other types of integrated circuits such as application specific integrated circuits (ASICs), memory integrated circuits, central processing units, microprocessors, analog integrated circuits, some combination thereof, etc.

In one embodiment, device 110 and device 120 may perform unidirectional and/or bidirectional communication over link 130 at speeds of up to approximately 10 gbps or greater in an active state. As shown, device 110 is configurable to support one or more communication standards. For instance, the PCS module 112 includes one or more selectable PCS modules 112a or 112b, as well as other modules not shown, each of which support different communication standards. Device 110 is configurable to operate using any of the communication standards supported by the individual PCS modules 112a and 112b. For instance, in one embodiment, PCS module 112a operates in compliance with the 10 GbE Ethernet communication standard that supports data rates of approximately 10 gbps. Also, PCS module 112b operates in compliance with the 40 GbE Ethernet communication standard that supports data rates of approximately 40 gbps. Further, device 110 may support other communication standards or protocols, as well as other Ethernet standards operating at different data rates (e.g., 100 GbE, etc.).

Depending on the PCS module that is selected in the transceiving device 110, one or more FEC encoding and decoding modules are configurable to support the data rates required by the selected PCS module. In particular, each PCS channel includes a FEC encoder and a FEC decoder. For instance, on the transmitting side, the one or more FEC encoding modules are selected from a plurality of FEC encoding modules 114a-n. Each FEC encoding module operates at a specified data rate. For instance, in one implementation, the FEC encoding module operates at a specified data rate of approximately 10 gbps. In one embodiment, the first PCS module 112a operates at a first data rate, and the second PCS module 112b operates at a second data rate. In one embodiment, the specified data rate is approximately equal to or less than both the first data rate and the second data rate. Further, in another embodiment, the first data rate is approximately a multiple of the specified data rate. In still another embodiment, the second data rate is approximately a multiple of the specified data rate. Similarly, on the receiving side of the device 110, one or more FEC decoding modules are selected from a plurality of FEC decoding modules 119a-n. As for the encoding modules described above, each FEC decoding modules operates at a specified data rate. For instance, in one implementation, the FEC decoding module operates at a specified data rate of approximately 10 gbps.

In one embodiment, the first PCS module operates at a data rate of approximately 10 gbps. A first group of FEC encoding modules and a first group of FEC decoding modules are configured to support the first PCS module 112a. The first group of FEC encoding modules is selectable from a plurality of FEC encoding modules, and the first group of FEC decoding modules is selectable from a plurality of FEC decoding modules. Further, the second PCS module operates at a data rate of approximately 40 gbps. A second group of FEC encoding modules and FEC decoding modules are configured to support the second PCS module 112b. The second group of FEC encoding modules is selectable from the plurality of FEC encoding modules, and the second group of FEC decoding modules is selectable from the plurality of FEC decoding modules. That is, one or more FEC encoding modules are selectable to support the first and second PCS modules, and one or more FEC decoding modules are selectable to support the first and second PCS modules. As such, when the specified data rate is approximately 10 gbps, the first group includes one FEC encoding module and one FEC decoding module, each capable of supporting a 10 gbps data rate associated with the first PCS module 112a. Also, at a specified data rate of approximately 10 gbps, the second group includes four FEC encoding modules and four FEC decoding modules, which in aggregate is able to support a 40 gbps data rate associated with the second PCS module 112b.

In one embodiment, device 120 is a receiving device and is configured to receive streams of information, and/or substreams of information from the transmitting device 110. In particular, transmitting device 110 delivers the substreams of information over one or more channels corresponding to a selected first PCS module 112a or second PCS module 112b. In general, the substreams are delivered between the PMA layers of each device (e.g., PMA 116 to PMA 126). At the receiving end, PMA 126 sends the substreams of information per channel to corresponding FEC decoding modules 129a-n. Each of the decoding modules operate at the specified data rate so that FEC modules in both devices 110 and 120 can communicate. As such, one or more FEC decoding modules are configured to receive packets of information from the one or more FEC encoding modules over the one or more channels. In one implementation, the FEC encoding modules and FEC decoding modules are configured on a one-to-one basis, such that one encoding module and one decoding module are communicatively coupled via one communication channel. At the backend of device 120, a PCS module 122 includes one or more PCS modules 122a and 122b, wherein each PCS module supports a different communication standard. For instance, PCS module 112a in device 110 and PCS module 122a in device 120 support the same communication standard (e.g., 10 GbE Ethernet). Also, PCS module 112b in device 110 and PCS module 122b of device 120 support the same communication standard (e.g., 40 GbE Ethernet).

Figure 2:
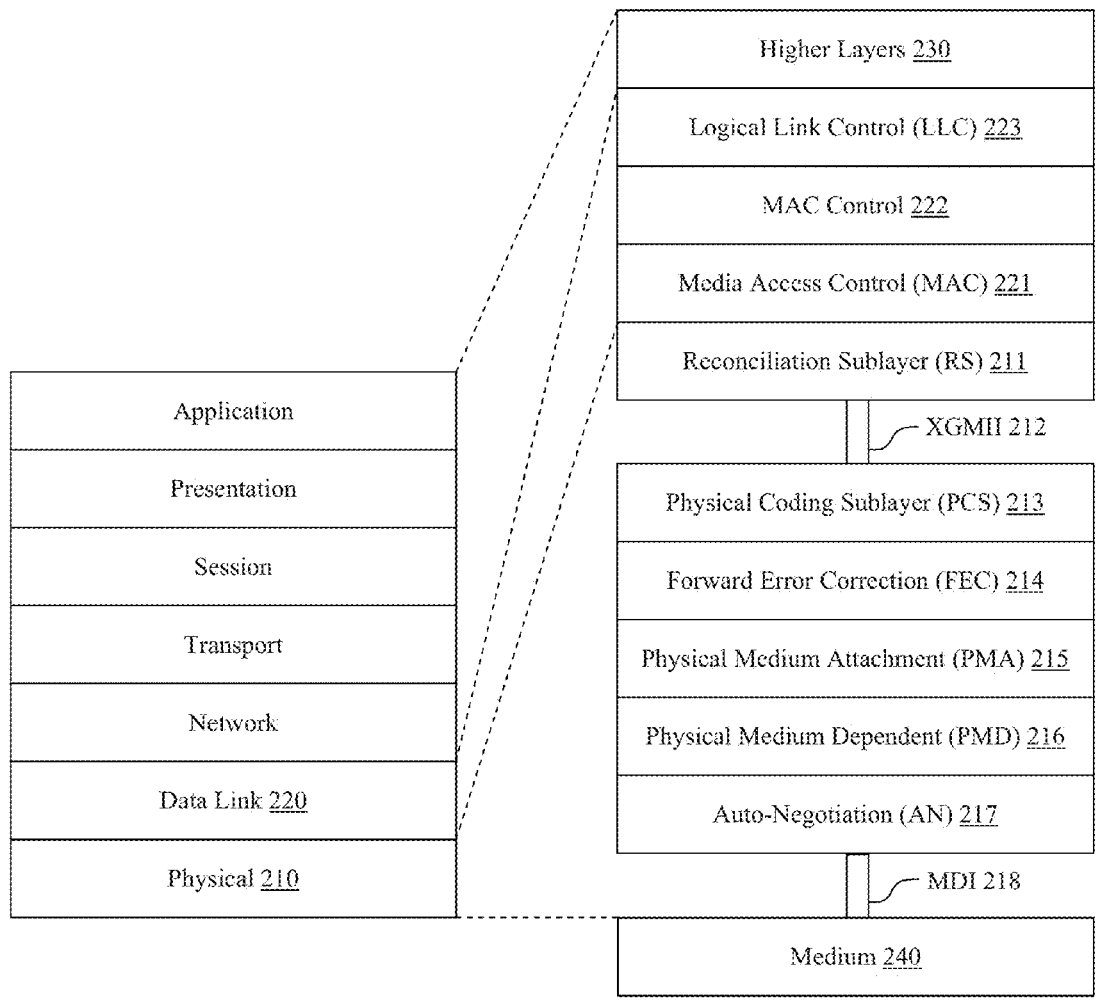
FIG. 2 shows an exemplary interface including a plurality of abstraction layers, in accordance with one embodiment of the present invention.

FIG. 2 shows an exemplary interface 200 including a plurality of abstraction layers in accordance with one embodiment of the present invention. In one embodiment, interface 200 may be used to implement or be included in device 110 and/or device 120 of FIG. 1. In another embodiment, interface 200 may be used to implement or be included in the transmitting device that includes the PCS transmitter 550 and/or the receiving device that includes the PCS receiver 580 of FIG. 5.

As shown in FIG. 2, interface 200 includes one or more physical layers 210, one or more data link layers 220, and one or more higher layers 230. The one or more physical layers may be communicatively coupled to medium 240, where medium 240 may be used to implement communication link 130 in one embodiment.

The one or more physical layers 210 may include reconciliation sublayer (RS) 211, 10 Gigabit media independent interface (XGMII) 212, physical coding sublayer (PCS) 213, forward error correction (FEC) sublayer 214, physical medium attachment (PMA) sublayer 215, physical medium dependent (PMD) sublayer 216, autonegotiation (AN) sublayer 217, medium dependent interface (MDI) 218, some combination thereof, etc. The one or more data link layers 220 may include media access control (MAC) sublayer 221, MAC control sublayer 222, logical link control (LLC) sublayer 223, some combination thereof, etc.

Turning back to FIG. 1, PCS 112 and/or PCS 122 may be implemented in accordance with PCS sublayer 213 in one embodiment. FEC 114 and/or FEC 124 may be implemented in accordance with FEC sublayer 214 in one embodiment. And in one embodiment, PMA 116 and/or PMA 126 may be implemented in accordance with PMA sublayer 215.

In one embodiment, system 100 may be a backplane system. For example, device 110 and/or device 120 may be a device (e.g., a computer blade, line card, switch card, etc.) that plugs into or otherwise couples to the backplane (e.g., a printed circuit board, motherboard, etc.), where communication link 130 is implemented using traces etched in copper of the backplane, circuitry coupled with the backplane, etc. In this manner, system 100 may be operated (e.g., in accordance with process 300 of FIG. 3) to communicate using one or more communication standards operating at one or more data rates in a backplane application, for instance in one embodiment.

Alternatively, device 110 and device 120 may be disposed remotely from one another (e.g., in different rooms of a building or house, across the nation, across the world, etc.). As such, communication link 130 may include twisted-pair cabling or some other medium (e.g., traces on a printed circuit board, pins, fiber optic cables and/or connections, etc.). Accordingly, system 100 may be operated (e.g., in accordance with process 300 of FIG. 3) to communicate using one or more communication standards operating at one or more data rates in a variety of other applications.

Figure 3:
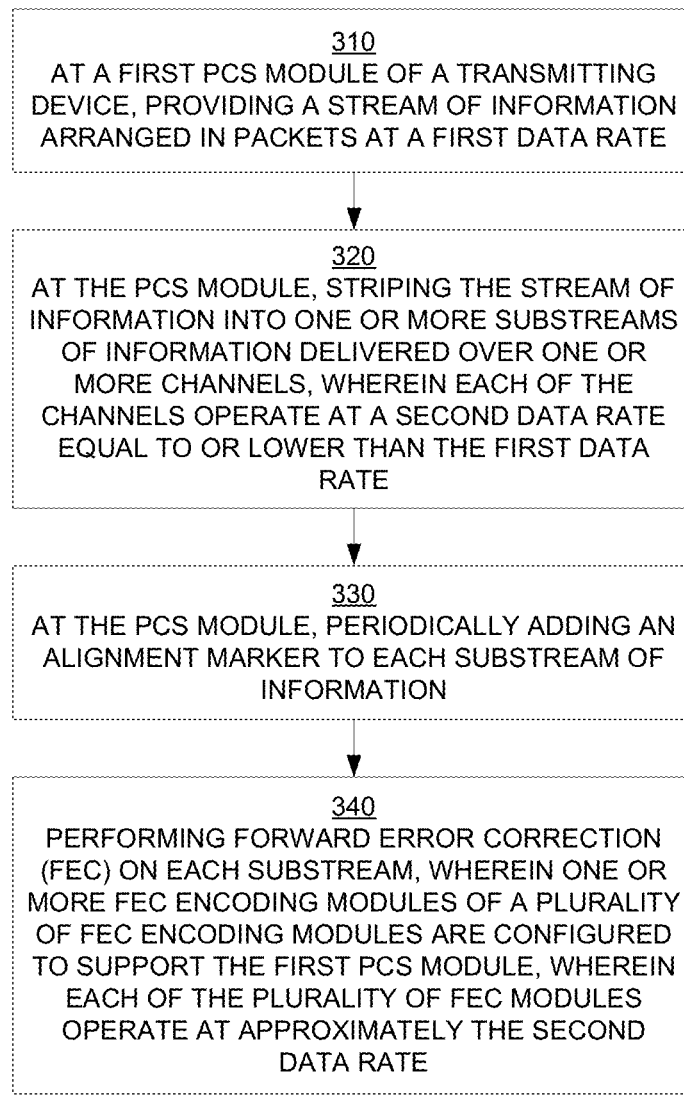
FIG. 3 is a flowchart illustrating an exemplary process for operating a communication circuit that is configurable to support one or more communication standards on a single device, in accordance with one embodiment of the present invention.

FIG. 3 is a flowchart 300 illustrating an exemplary process for operating a communication circuit that is configurable to support one or more communication standards on a single device, in accordance with one embodiment of the present invention. The flowchart 300 is implemented by system 100 for enabling devices to communicate over a communication link in accordance with one embodiment of the present invention. The operations performed in FIG. 3 describes the transmission of information from a transmitting device.

As shown in FIG. 3, a stream of information is provided 310 at a first PCS module of a transmitting device. The stream of information is arranged in packets and delivered at a first data rate. That is, the stream of information conforms to a communication standard that is implemented by the first PCS module. In one embodiment, the first data rate is approximately 10 gbps in conformance with the 10 GbE communication standard. In another embodiment, the first data rate is approximately 40 gbps in conformance with the 40 GbE communication standard. In still other embodiments, the first data rate is a multiple of approximately 10 gbps (e.g., 100 gbps for a 100 GbE communication standard).

The stream of information is striped 320 into one or more substreams of information that is delivered over one or more channels. Each of the channels operates at a second data rate that is equal to or lower than the first data rate. In another embodiment, the first data rate is approximately 40 gbps and the second data rate is approximately 10 gbps. In one embodiment, the first data rate is approximately equal to the second data rate (e.g., 10 gbps) and the striping process essentially channels the stream of information into one channel. In still another embodiment, the first data rate is approximately equal to a multiple of the second data rate.

The stream of information is striped to accommodate one or more communication standards operating at one or more data rates. For instance, as previously described, a PLD (e.g., FPGA) device for communication is configurable to support one or more data rates, such as, 10 gbps, 40 gbps, 100 gbps, etc. for the Ethernet communication standard. In that manner, a single type of FEC module operating at a specified data rate, such as 10 gbps, can be aggregated in any number of combinations to support one more communication standards and/or one or more data rates of communication standards.

The PCS module also adds 330 an alignment marker to each substream of information. The alignment marker is added on a periodic basis. In one embodiment, the periodic adding of markers ensures that alignment markers are added to each 66-bit word or block. In one embodiment, alignment markers are added across all virtual lanes or channels at the same time, and periodically added at the same time across all channels. In that manner, the virtual lanes and/or channels may be properly aligned using the alignment markers when receiving the data.

A dedicated FEC module performs 340 forward error correction on each substream. A plurality of FEC encoding modules are available to perform forward error correction, wherein each of the plurality of FEC modules operate at approximately the second data rate. One or more FEC encoding modules are configured in various combinations or groupings to support one or more communication standards or data rates of communication standards. For instance, one or more FEC encoding modules, a first grouping, are configured to support the first PCS module.

In one embodiment, the transmitting device also includes a second PCS module. In that manner, the transmitting device can be configured to support both the first and second PCS modules, and more particularly, configured to support data rates of both the first and second PCS modules. More particularly, one or more FEC encoding modules, a second grouping, are configured to support the second PCS module. The second PCS module operates at a third data rate that is different than (e.g., greater than) the second data rate. In one embodiment, the third data rate is approximately equal to a multiple of the second data rate. For instance, in one embodiment the first data rate is 10 gbps and the third data rate is approximately 40 gbps. In another embodiment, the first data rate is 10 gbps and the third data rate is approximately 100 gbps. In still another embodiment, the first data rate is 40 gbps and the third data rate is approximately 100 gbps.

In the method of flow chart 300, a receiving device is configured to receive the substreams of information transmitted from the transmitting device. In particular, one or more FEC decoding modules are configured to receive the substreams of information and perform error correction. In addition, the receiving device performs block synchronization, block alignment, reordering, deskewing destriping, and descrambling between the substreams of information provided over the one or more channels.

In particular, the receiving device is configurable to support one or more communication standards, and/or one or more data rates of communication standards. In particular, a plurality of FEC decoding modules are available to perform FEC decoding. Each of the plurality of FEC decoding modules operate at approximately the second data rate. One or more FEC decoding modules are configured in various combinations or groupings to support one or more communication standards or data rates of communication standards. For instance, one or more FEC decoding modules, a first grouping, are configured to support the data rate of the first PCS module. Also, one or more FEC decoding modules, a second grouping, are configured to support the data rate of the second PCS module.

The decoding modules perform FEC decoding, such as, error correction. However, when the FEC decoder determines that an error is fatal or uncorrectable, the FEC decoder is configured to mark that word with a fatal error. As will be described in relation to FIG. 4, the SYNC field is marked with a [1,1] value to signify a fatal error, in one implementation. In another, the SYNC field is marked with a [0,0] value to signify a fatal error. Additionally, since the block or word containing the fatal error is associated with a packet of information, of which only parts may be striped or sent to the FEC decoding module discovering the fatal error, error marking must be performed by the decoding module to ensure that other 66-bit words or blocks of information in that packet are associated with the fatal error, and subsequently dropped. For instance, error marker 980 of a decoding module of FIG. 9 performs the error marking, in one implementation.

As such, in one embodiment, every 66-bit block or word being processed by the FEC decoding module is marked with an error value in the SYNC field. In another embodiment, every other 66-bit word or block is marked with the error. This ensures that the all possible 64B packets contained within the FEC decoding module at the time of discovering the fatal error will be dropped by the upper layers (e.g., MAC sublayer). In one embodiment, a packet contains sixty-four or thirty-two 64/66 bit words or blocks. In another embodiment, the FEC decoding module is configured to handle 32 66-bit words or blocks. As an example, in the case where data rates of 40 gbps are supported by the PCS modules, at least 16 of 32 66-bit word or blocks are marked with an error. In another example, in the case where data rates of 100 gbps are supported by the PCS modules, all thirty-two 66-bit word or blocks are marked with an error. In that example, for consistency within the system, all thirty-two 66-bit words or blocks are marked bad for decoding modules supporting data rates of 40 gbps. As such, for 64B or larger packets, every other 66-bit word or block is marked with an error, in one embodiment. For consistency between smaller and larger packets, all 66-bit words or blocks handled by a decoding FEC are marked with an error.

Additionally, the receiving device includes a SYNC state machine for determining when a lane or channel is in-lock. In particular, the SYNC state machine determines a lane is in-lock when 64 non-errored SYNC blocks in a row are encountered from a corresponding FEC decoding module. That is, the SYNC fields in sixty-four 66-bit words do not contain an error. This allows a lane to go from being out-of-lock to in-lock. Also, the SYCN state machine is configured to determine that a lane is out-of-lock when discovering 16 errored SYNC blocks out of 64 SYNC blocks. That is, out of sixty-four 66-bit words or blocks, 16 of the 66-bit words or blocks contain an error in their corresponding SYNC fields. In other words, going to an out-of-lock condition takes 65 errors out of a 1024 sync window. Also, when in lock, two uncorrectable FEC blocks are allowed, in one embodiment.

Also, the receiving device includes a bit-error-rate (BER) state machine for determining when errors exceed a tolerance. For instance, the BER state machine determines a high BER when 97 errored SYNC blocks are discovered in a 500 microsecond window (e.g., for 100 gbps data rates), in one embodiment. For instance, a high BER is declared when there are at least 97 sync errors in a 125 microsecond window (e.g., for 40 gbps data rates), in another embodiment. Also, three uncorrectable FEC blocks are allowed without going to the high BER state, in one embodiment.

Figure 4:
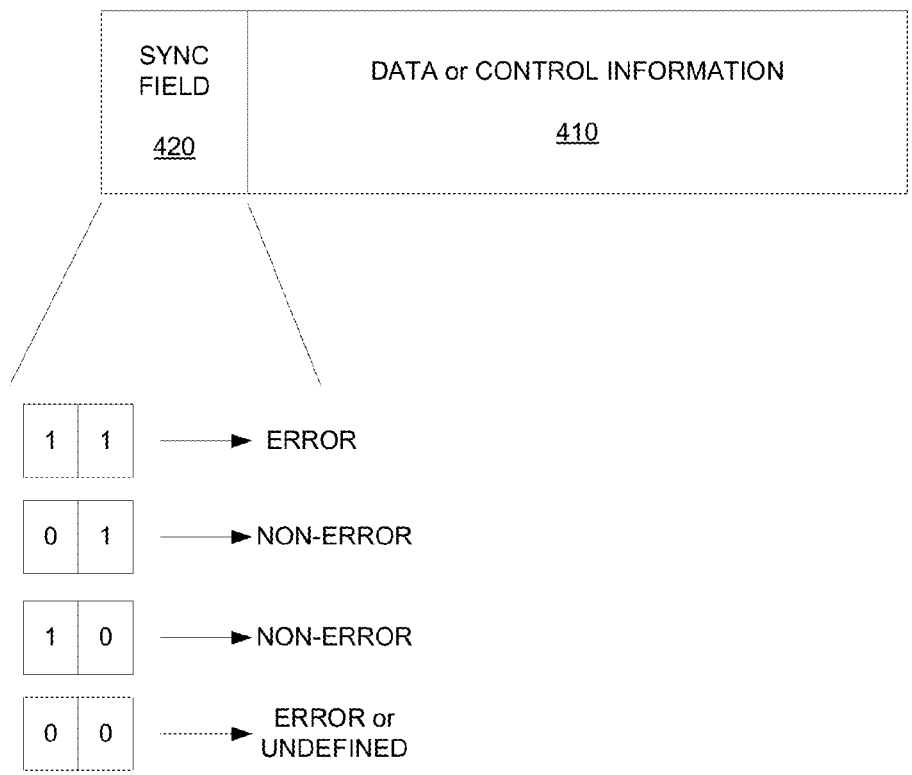
FIG. 4 is a diagram of a 66-bit word or block 400 that includes a SYNC field used for error marking, in accordance with one embodiment of the present invention.

For purposes of illustration, FIG. 4 is a diagram of a 66-bit word or block 400 that includes a SYNC field, in accordance with one embodiment of the present invention. As shown, the word consists of information 410. The information may be data or control information. If the information 410 includes data, then word 400 is a data word. On the other hand, if the information includes control information, then word 400 is a control word. For example, the control information may include start of packet, end of packet, and other managed information. Also, the 66-bit word 400 includes a SYNC field 420. The SYNC field 420 indicates whether word 400 is a data word or control word. In one embodiment, the SYNC field 420 is a 2-bit value. In addition, the SYNC field 420 may indicate an error in some embodiments. As such, for a 2-bit SYNC field 420, a value of [0,1] or [1,0] does not indicate an error, and indicates whether word 400 is a data or control word. In one embodiment, a value of [1,1] in the SYNC field 420 indicates that the word 400 contains a fatal error. The value of [0,0] in the SYNC field 420 is undefined, or may indicate some type of error within word 400 (e.g., improper framing, etc.). In some embodiments, [0,0] in the SYNC field 420 may also indicate a fatal error.

Figure 5:
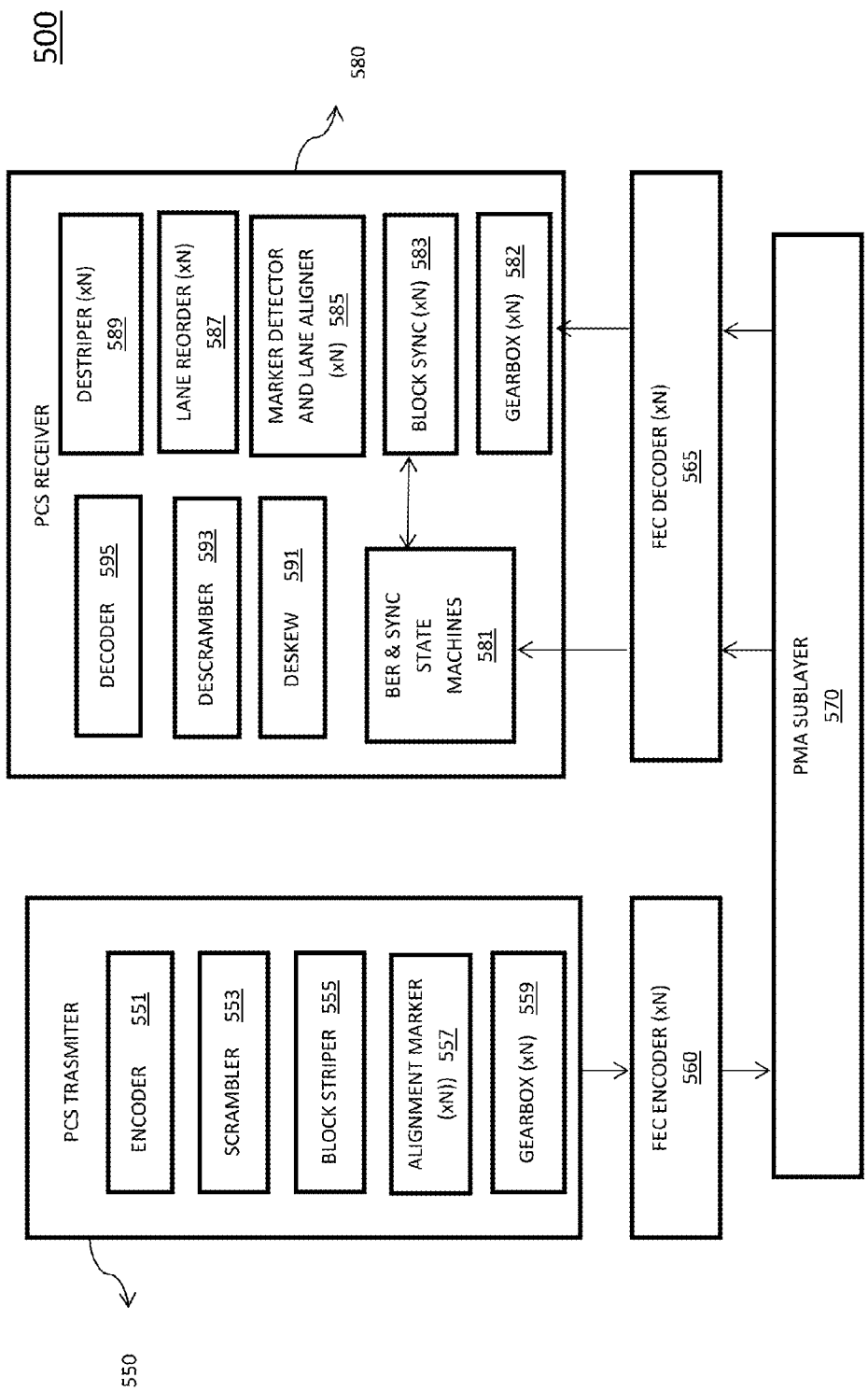
FIG. 5 shows an exemplary system for enabling devices to communicate over a communication link, in accordance with one embodiment of the present invention.

FIG. 5 is a data flow diagram 500 illustrating the relationships between the FEC, PCS, and PMA, in accordance with one embodiment of the invention. In particular, diagram 500 illustrates the flow of information from a transmitting device to a receiving device. In one implementation, data flow diagram 500 illustrates the flow of information through system 100 of FIG. 1.

As shown in FIG. 5, a transmitting device includes a PCS transmitter 550. Data processing within the transmitting device includes delivering data from the MAC layer of the transmitting device to the PCS transmitter 550. The encoder 551 encodes the data into a continuous stream of 64B/66B blocks. That is, data from the MAC layer is transformed into 66-bit blocks. Scrambler 553 scrambles the data for security purposes and/or to create transition density in the data, in embodiments. Block striper 555 takes the 66-bit scrambled data and stripes it over one or more lanes, depending on the PCS module that is chosen, as described previously in relation to FIG. 1. For instance, for a 40 GbE PCS module, the data is striped over four virtual lanes or channels, each configured to operate at approximately 10 gbps. As such, a packet of data includes multiple blocks of data which are striped across one or more channels. In one embodiment, the data is striped using a round robin mechanism, though other striping techniques are supported. A unique alignment marker is added to each virtual lane by the alignment marker 557 on a periodic basis. In one embodiment, an alignment marker is added to each 66-bit block. These alignment markers are used by the receiving device to identify, deskew, and reorder the data from the lanes or channels. Gearbox 559 may be used to adjust the width of the blocks. Each lane or channel of data is delivered to a corresponding FEC encoder 560 in the transmitting device, where forward error correction is performed.

The PMA sublayer 570 of the transmitting device and the receiving device acts to facilitate the transmission and receipt of high speed serial data streams. For instance, one PMA channel may consist of full duplex paths (transmit and receive) with input/output (I/O) buffers, programmable output voltage, pre-emphasis and equalization, clock data recover (CDR), and serializer/deserializer (SERDES) blocks.

The receiving device includes the PCS receiver 580, which receives one or more channels of information from the PMA sublayer 570. As previously described, for each channel of information, a corresponding FEC decoder 565 corrects any correctable errors, and marks one or more blocks when detecting an uncorrectable error. Gearbox 582 provides for width adjustment of the received blocks. Module 581 includes a SYNC state machine and a bit error rate (BER) state machine. The SYNC state machine in module 581 determines if a lane is locked or out-of-lock. The BER state machine in module 581 determines whether the error rate of the received data is tolerable. The block SYNC module 583 performs word or block alignment. The marker detector and lane aligner module 584 detects the placement of the alignment markers in a substream of data, and aligns all of the lanes of data using the alignment markers. Lane reorder module 587 acts to reorder the lanes. The destriper module 589 destripes the data, and deskew module 591 rebuilds the 66-bit data stream. The descrambler module 593 descrambles the data in association with the scrambler 553. The decoder 595 decodes the information back to a 64-bit blocks suitable for delivery to the MAC layer of the receiving device.

To illustrate in more detail, the BER state machine in module 581 determines a high bit error rate when discovering 97 errored SYNC blocks out of a 500 microsecond window for data rates of approximately 100 gbps, and 97 errored WYNC blocks out of a 125 microsecond window for data rates of approximately 40 gbps. That is, each of the sixteen blocks of data includes SYNC bits that indicate an error. As described previously, FIG. 4 illustrates a two-bit SNC field that is configurable to indicate an error. At that point, a higher bit error rate may be implemented within system 500.

As described previously, the SYNC state machine in module 581 determines if a lane is in-lock or is out-of-lock. In particular, the SYNC state machine examines the SYNC fields in 66 bit blocks of a corresponding FEC decoder that is associated with a corresponding channel. The lane is in lock, when the SYNC state machine determines that 64 non-errored SYNC blocks have occurred. That is, in a group of blocks contained in the FEC decoder, 64 blocks have SYNC fields that do not indicate an error. In one embodiment, the group of blocks is 64 blocks, and in another embodiment, the group contains 65 blocks. In addition, the lane is out-of-lock when the SYNC state machine determines that there are 16 errored SYNC blocks out of 64 SYNC blocks.

Figure 6:
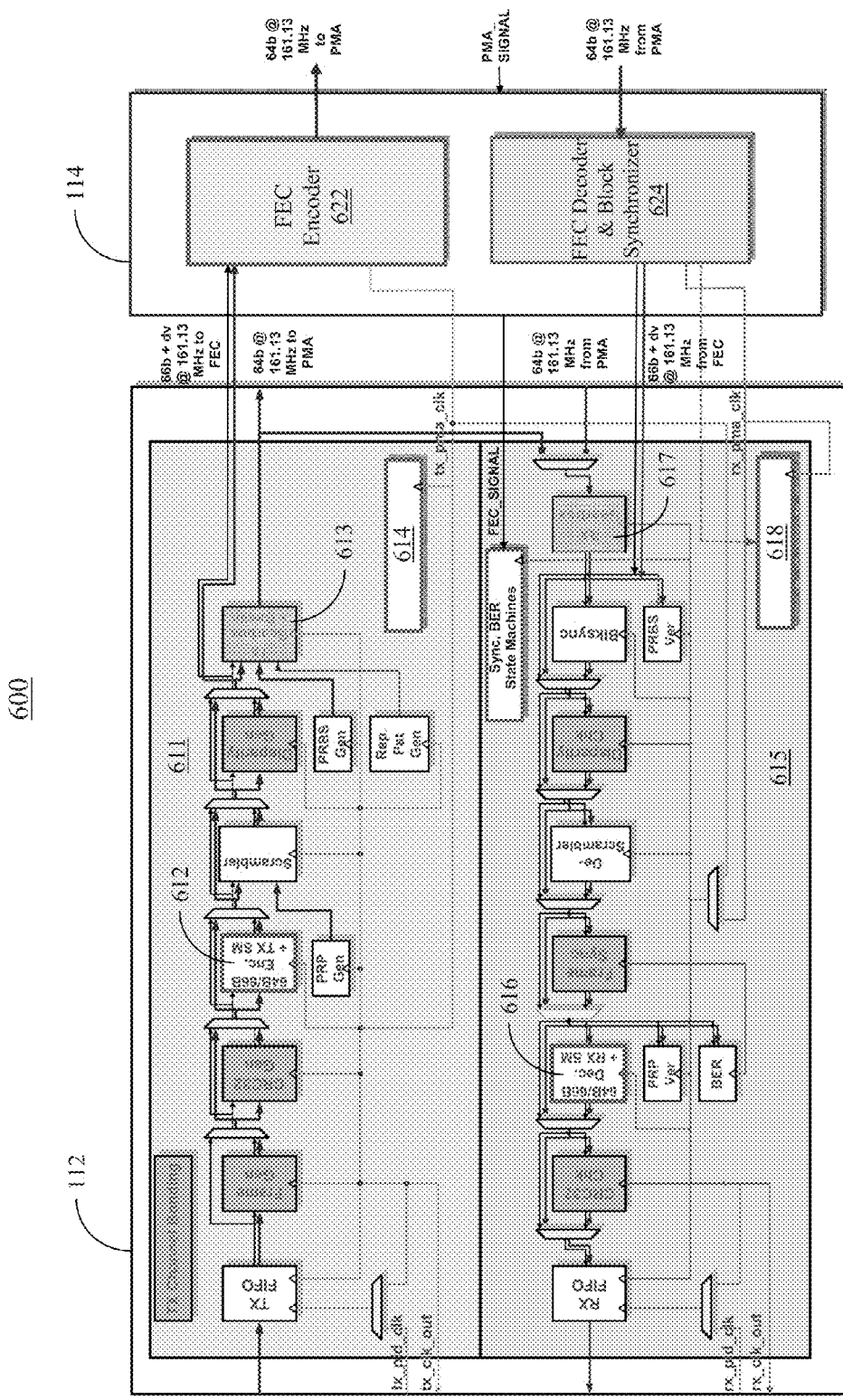
FIG. 6 shows an exemplary system is configurable to support a communication standard, wherein a representative channel of a multi-channel system provides for communication, in accordance with one embodiment of the invention.

FIG. 6 shows exemplary system 600 for operating a communication circuit that is configurable to operate under a communication standard on a single device, in accordance with one embodiment of the present invention. In addition, system 600 is representative of a device including one or more channels, wherein a representative channel is shown, wherein the system 600 is configurable to communicate over one or more communication standards by using one or more channels to send data, in accordance with one embodiment of the present invention.

As shown in FIG. 6, transmitter 611 of PCS 112 may be used to transmit data over one channel or lane to another device (e.g., second device 120 via FEC Encoder 622) over a communication link (e.g., 130), whereas receiver 615 of PCS 112 may be used to receive data transmitted from another device (e.g., second device 120 via FEC Decoder & Block Synchronizer 624) over the communication link (e.g., 130). In one embodiment, the transmitter 611 is operating at a data rate of 10 gbps to deliver data over a corresponding channel. One or more channels may be aggregated to support one more communication standards operating at one or more data rates.

As shown in FIG. 6, encoding and/or transmission of the symbol at PCS 112 may be controlled by state machine 614. Also, decoding and/or receiving of the symbol at PCS 112 may be controlled by state machine 618.

Turning back to FIG. 6, transmitter 611 of PCS 112 may include various components for processing and/or communicating data as part of an output data path of PCS 112. It should be appreciated that these components of transmitter 611 are well known in the art, and thus, are not described in detail herein. Additionally, receiver 615 of PCS 112 may include various components for processing and/or communicating data as part of an input data path of PCS 112. It should be appreciated that these components of receiver 615 are well known in the art, and thus, are not described in detail herein.

Although FIG. 6 shows a specific number of components, it should be appreciated that system 600 may include a different number of components in other embodiments. Additionally, although FIG. 6 shows a specific arrangement of components, it should be appreciated that system 600 may include a different arrangement of components in other embodiments.

Figure 7:
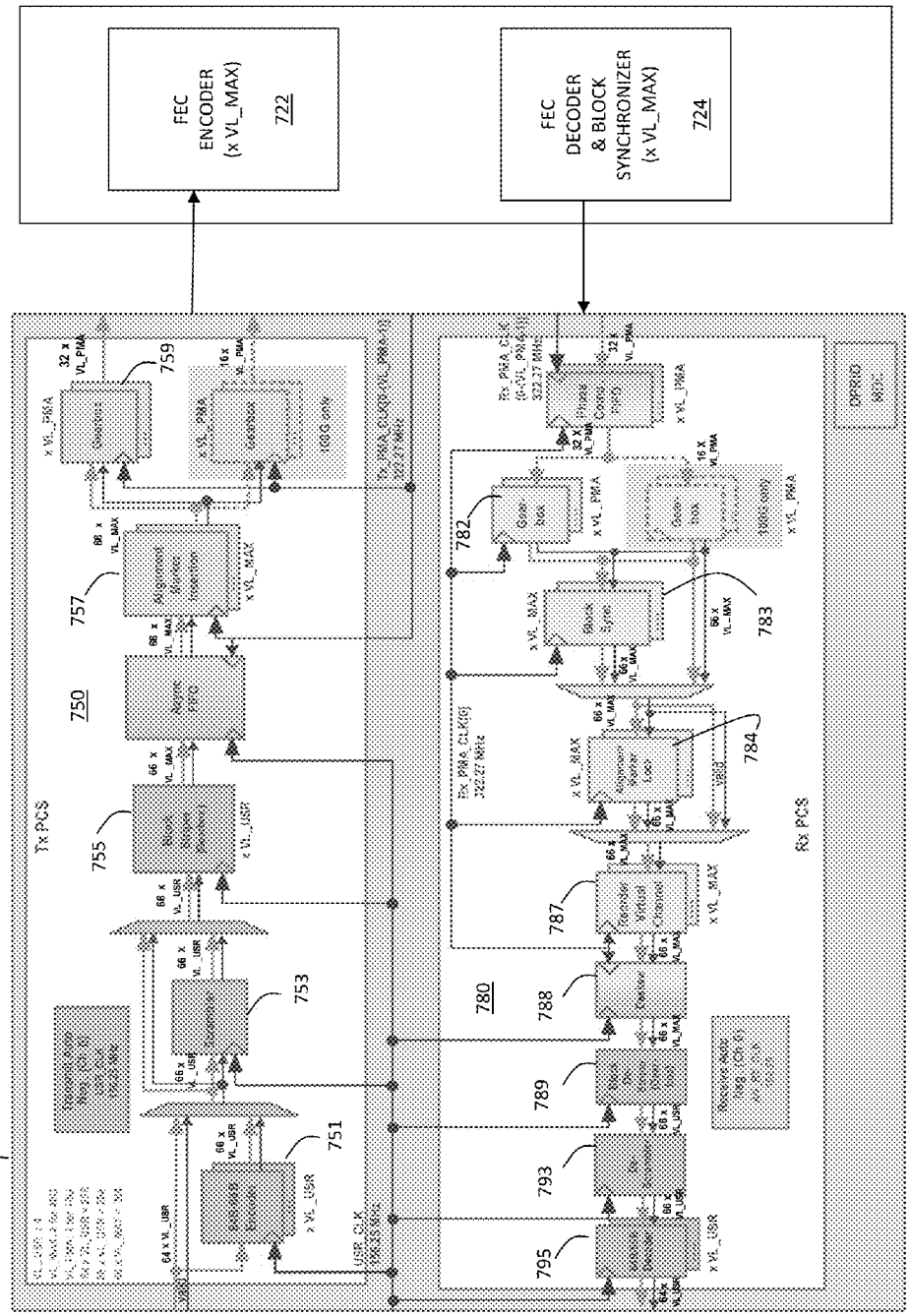
FIG. 7 shows exemplary system 600 for operating a communication circuit that is configurable to support one or more communication standards on a single device, in accordance with one embodiment of the present invention.

FIG. 7 shows exemplary system 700 for operating a communication circuit that is configurable to support one or more communication standards on a single device, in accordance with one embodiment of the present invention. As shown in FIG. 7, transmitter PCS 750 may be used to transmit data over one channel or lane to another device (e.g., second device 120 via FEC Encoder 722) over a communication link (e.g., 130), whereas receiver PCS 780 may be used to receive data transmitted from another device (e.g., second device 120 via FEC Decoder & Block Synchronizer 724) over the communication link (e.g., 130). In one embodiment, the transmitter PCS 750 may operate at one or more data rates (e.g., 10 gbps, 40 gbps, etc.) to deliver data over a corresponding channel. One or more channels may be aggregated to support one more communication standards operating at one or more data rates.

As shown in FIG. 7, a transceiver 710 includes a PCS transmitter 750. Data processing within the transmitting device includes delivering data from the MAC layer of the transmitting device to the PCS transmitter 750. The encoder 751 encodes the data into a continuous stream of 64B/66B blocks. That is, data from the MAC layer is transformed into 66-bit blocks. Scrambler 753 scrambles the data for security purposes and/or to create transition density in the data, in embodiments. Block striper 755 takes the 66-bit scrambled data and stripes it over one or more lanes, depending on the PCS module that is chosen, as described previously in relation to FIG. 1. From this point, the data is grouped and striped across one or more virtual lanes and/or channels. As such, a packet of data includes multiple blocks of data which are striped across one or more channels. A unique alignment marker is added to each virtual lane by the alignment marker 757 on a periodic basis. These alignment markers are used by the receiving device to identify, deskew, and reorder the data from the lanes or channels. Gearbox 759 may be used to adjust the width of the blocks. Each lane or channel of data is delivered to a corresponding FEC encoder 722 in the transmitting device, where forward error correction is performed.

The transceiver 710 includes a PCS receiver 780, which receives one or more channels of information from a PMA sublayer. As previously described, for each channel of information, a corresponding FEC decoder 724 corrects any correctable errors, and marks one or more blocks when detecting an uncorrectable error. Gearbox 782 provides for width adjustment of the received blocks. PCS receiver 780 also includes a SYNC state machine (not shown) and a BER state machine (not shown) previously discussed in part in relation to FIG. 6. The SYNC state machine determines if a lane is locked or out-of-lock. The BER state machine determines whether the error rate of the received data is tolerable. The block SYNC module 783 performs word or block alignment. The marker detector and lane aligner module 784 detects the placement of the alignment markers in a substream of data. Lane reorder module 787 acts to reorder the lanes. The deskew module 788 deskews each lane of information to rebuild the 66-bit data stream. From this point on the lanes are aggregated, such that the information is realigned. The destriper module 789 destripes the data. The descrambler module 793 descrambles the data in association with the scrambler 553. The decoder 795 decodes the information back to a 64-bit blocks suitable for delivery to the MAC layer of the receiving device.

In FIG. 7, transmitter PCS 750 of transceiver 710 may include various components for processing and/or communicating data as part of an output data path. It should be appreciated that these components of transmitter PCS 750 are well known in the art, and thus, are not described in detail herein. Additionally, receiver PCS 780 of the transceiver 710 may include various components for processing and/or communicating data as part of an input data path. It should be appreciated that these components of receiver PCS 780 are well known in the art, and thus, are not described in detail herein.

Although FIG. 7 shows a specific number of components, it should be appreciated that system 700 may include a different number of components in other embodiments. Additionally, although FIG. 7 shows a specific arrangement of components, it should be appreciated that system 700 may include a different arrangement of components in other embodiments.

In one embodiment, a circuit for providing communication includes a transceiver that is configurable to support one or more communication standards. In one implementation, the transceiver described is representative of transceiver 710 of FIG. 7. The transceiver includes a receiving device configurable to support multiple communication standards. In particular, the receiving device receives packets of information over one or more channels, wherein the channel configuration corresponds to a selected first or second PCS module from a transmitting device. More particularly, the first PCS module operates at a first data rate of approximately 10 gigabits per second (gbps), and wherein the second PCS module operates at a second data rate of approximately 40 gbps. The first PCS module is in compliance with the 10 GbE communication standard, and the second PCS module is in compliance with the 40 GbE communication standard. Also, the receiving device comprises a plurality of FEC decoding modules, each of which operates at a specified data rate of approximately 10 gigabits per second. One or more FEC decoding modules are configurable to receive the packets of information from the one or more FEC encoding modules over the one or more channels.

Figure 8:
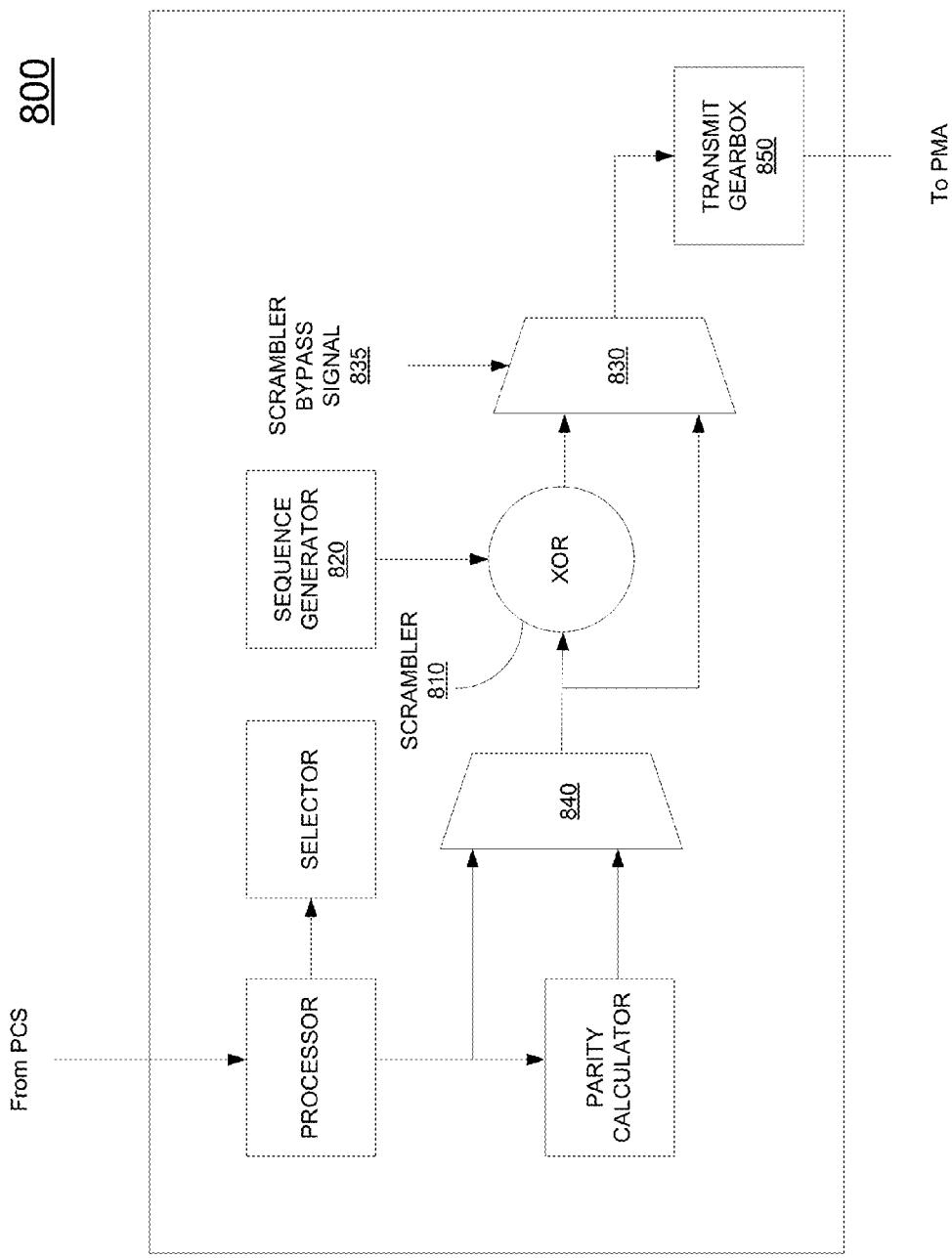
FIG. 8 shows an exemplary FEC encoder for providing forward error correction over a channel, in accordance with one embodiment of the present invention.

FIG. 8 shows exemplary FEC encoder 800 for performing forward error correction over a channel of a device configurable to send communication over one or more communication standards, in accordance with one embodiment of the present invention. FEC encoder 800 is representative of encoder 622 of FIG. 6 and operates to send communication over one communication standard, such as, a 10 GbE communication standard operating at a 10 gbps data rate, in one embodiment. In another embodiment, encoder 800 is representative of encoder 722 of FIG. 7 and operates to send communication over a single channel in a multi-channel system.

As shown in FIG. 8, a scrambler (e.g., 810) of a FEC (e.g., 114) of a first device (e.g., 110) may be used to scramble data received from a PCS (e.g., 112) for communication to a PMA (e.g., 116), where the scrambler (e.g., 810) may transform the data by applying a sequence (e.g., a pseudo-random bit sequence or PRBS generated by sequence generator 820) to the data. In some cases, scrambler 810 may be advantageously bypassed (e.g., by asserting scrambler bypass signal 835 to control multiplexer 830 to bypass scrambler 810 and communicate data from multiplexer 840 to transmit gearbox 850) in accordance with an embodiment of the present invention. Bypassing the scrambler (e.g., 810) may cause the output from the FEC encoder (e.g., 800) to be a deterministic pattern that can be used by the receiver (e.g., of device 120) to more quickly identify block boundaries in the received data, e.g., establishing rapid "block lock" at the second device (e.g., 120).

Figure 9:
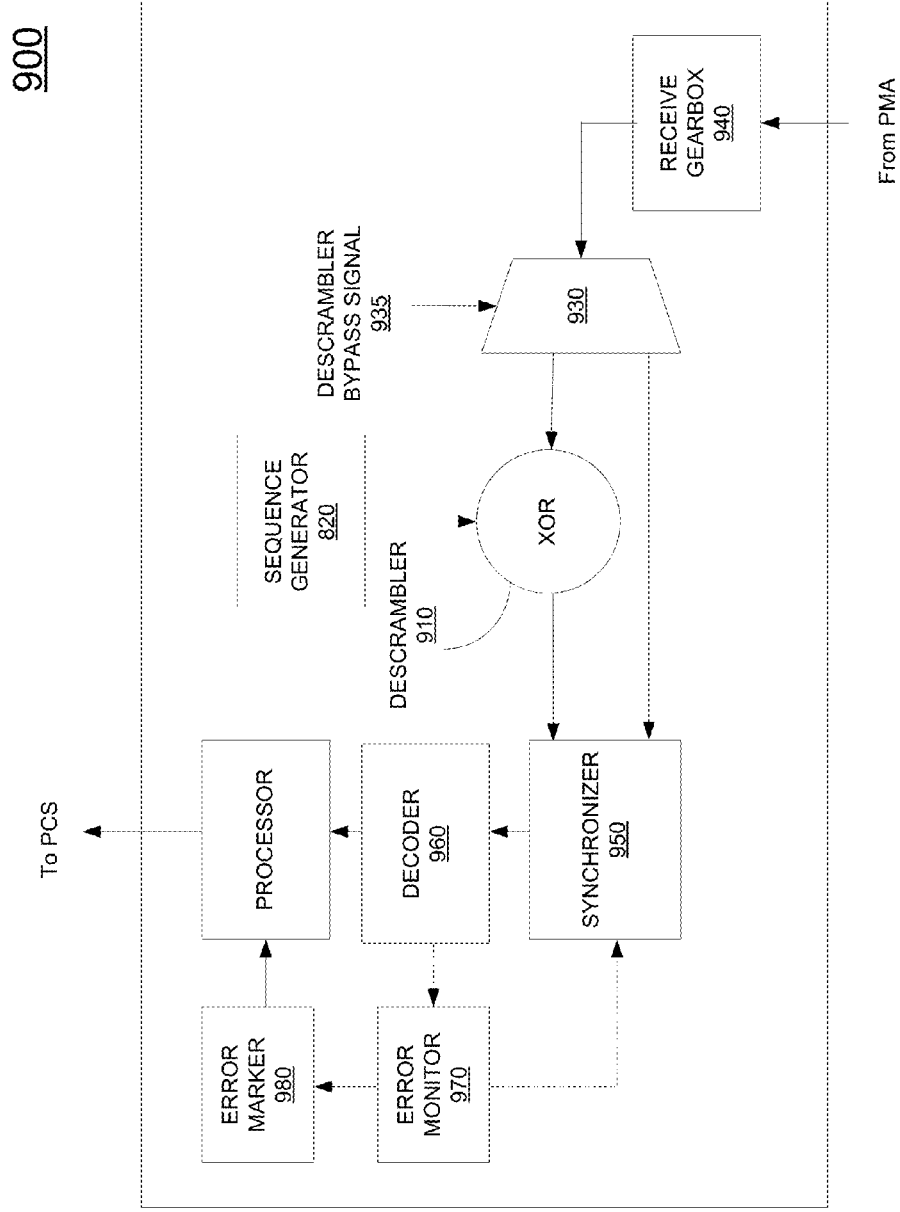
FIG. 9 shows an exemplary FEC decoder & block synchronizer for providing decoding of errors over a channel, in accordance with one embodiment of the present invention.

FIG. 9 shows exemplary FEC decoder & block synchronizer 900 that is configurable to support one or more communication standards, in accordance with one embodiment of the present invention. As shown in FIG. 9, a descrambler (e.g., 910) of a FEC (e.g., 124) of a second device (e.g., 910) may be used to descramble data received from a PMA (e.g., 126) for communication to a PCS (e.g., 122), where the descrambler (e.g., 910) may transform the data by applying a sequence (e.g., a pseudo-random bit sequence or PRBS generated by sequence generator 920) to the data. Additionally, responsive to a request (e.g., generated by and communicated from the first device 110) to initiate a transition to the active state from the low-power state, descrambler 910 may be bypassed (e.g., by asserting scrambler bypass signal 935 to control multiplexer 930 to bypass descrambler 910 and communicate data from receive gearbox 940 to synchronizer 950). Bypassing the descrambler (e.g., 910) may cause the output from a component of the FEC (e.g., multiplexer 930 of FEC 124 of device 120, another component of FEC 124 of device 120, etc.) to be a deterministic pattern that can be used by the receiver (e.g., of device 120) to more quickly identify block boundaries in the received data, e.g., establishing rapid "block lock" at the second device (e.g., 120).

In one embodiment, a scrambler (e.g., 1310) of the transmitter (e.g., first device 110) and a descrambler (e.g., 910) of the receiver (e.g., second device 120) may be bypassed to accelerate block lock at the second device. In one embodiment, scrambler 1310 and/or sequence generator 920 may include an additive scrambler, multiplicative scrambler, etc. Descrambler 910 and/or sequence generator 920 may include an additive descrambler, multiplicative descrambler, etc. And in one embodiment, sequence generator 1320 and/or sequence generator 920 may include a linear feedback shift register (LFSR).

As shown in FIG. 9, FEC decoder & block synchronizer 900 includes a decoder module 960 for performing error correction. In part, decoder 900 provides information to error monitor module 970 for monitoring errors within the stream or substream of information flowing through the channel handled by the FEC decoder & block synchronizer 900. When the error monitor discovers a fatal error, error marker 980 marks the SYNC fields of appropriate 66-bit words, as previously described.

As shown in FIG. 8, FEC encoder 800 may include various components for processing and/or communicating data. It should be appreciated that these components of FEC encoder 622 are well known in the art, and thus, are not described in detail herein. Additionally, FEC decoder & block synchronizer 900 of FIG. 9 may include various components for processing and/or communicating data. It should be appreciated that these components of FEC decoder & block synchronizer 900 are well known in the art, and thus, are not described in detail herein.

Although FIGS. 8 and 9 show a specific number of components, it should be appreciated that FEC encoder 800 and/or FEC decoder & block synchronizer 900 may include a different number of components in other embodiments. Additionally, although FIGS. 8 and 9 show a specific arrangement of components, it should be appreciated that FEC encoder 800 and/or FEC decoder & block synchronizer 900 may include a different arrangement of components in other embodiments.

Programmable Logic Device

Figure 10:
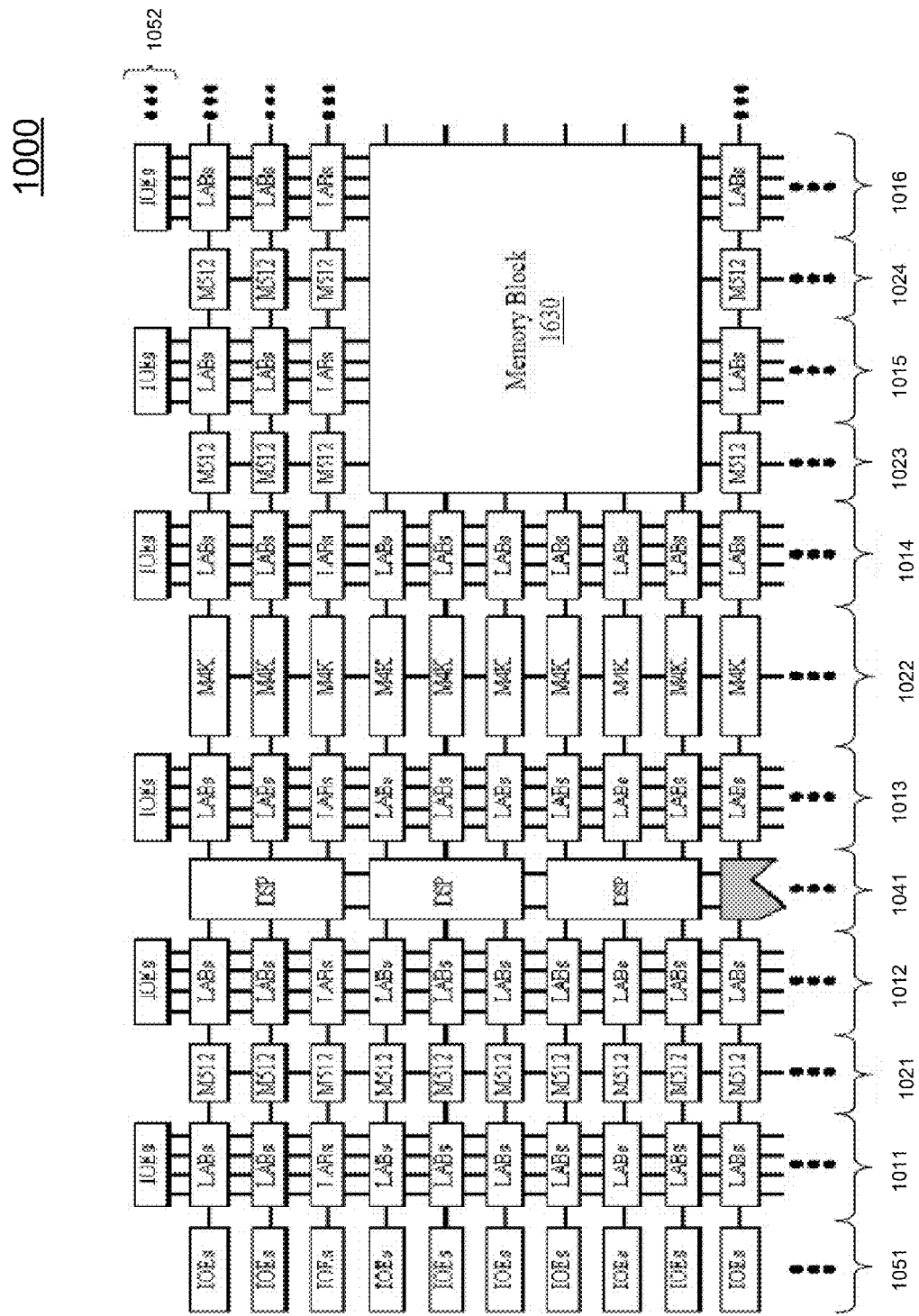
FIG. 10 shows an exemplary programmable logic device (PLD) that can be used to implement one or more aspects of the present invention.

FIG. 10 shows exemplary programmable logic device (PLD) 1000 that can be used to implement one or more components of one or more embodiments of the present invention. For instance, PLD 1000 may be used to implement a PCS (e.g., 112, 122, etc.), a FEC (e.g., 114, 124, etc.), a PMA (e.g., 116, 126, etc.), some combination thereof, etc. PLD 1000 of FIG. 10 may be used to implement a field programmable gate array (FPGA), a complex programmable logic device (CPLD), programmable logic arrays (PLAs), or some other type of programmable logic device.

As shown in FIG. 10, PLD 1000 may include a plurality of programmable logic array blocks (LABs). The LABs of PLD 1000 may be arranged in rows and/or columns (e.g., as two-dimensional arrays) in one embodiment. For example, columns 1011, 1012, 1013, 1014, 1015 and 1016 may include one or more LABs. In one embodiment, the LABs may be interconnected by a network of column interconnect conductors and/or row interconnect conductors.

Each LAB may include logic that can be configured to implement one or more user-defined logic functions. For example, the interconnect structure of a LAB may be programmed to interconnect the components of the LAB in one or more desired configurations. A LAB may include at least one look-up table (LUT), at least one register, at least one multiplexer, some combination thereof, etc. In one embodiment, the logic may be organized into a plurality of logic elements (LEs), where the interconnection of the LEs can be programmed to vary the functionality of the LAB.

As shown in FIG. 10, PLD 1000 may include a plurality of memory blocks (e.g., memory block 1030, memory blocks in columns 1021, 1022, 1023, 1024, etc.). In one embodiment, a memory block may include random access memory (RAM), where the RAM may be used to provide dedicated true dual-port memory, simple dual-port memory, single-port memory, or some combination thereof. And in one embodiment, a memory block may include at least one shift register, at least one first-in-first-out (FIFO) buffer, at least one flip-flop, some combination thereof, etc.

The memory blocks of PLD 1000 may be arranged in rows and/or columns (e.g., as two-dimensional arrays) in one embodiment. For example, columns 1021, 1022, 1023 and 1024 may include one or more memory blocks. Alternatively, one or more memory blocks (e.g., 1030) may be located individually or in small groups (e.g., of two memory blocks, three memory blocks, etc.) in the PLD.

As shown in FIG. 10, PLD 1000 may include a plurality of digital signal processing (DSP) blocks. The DSP blocks may provide digital signal processing functions such as finite impulse response (FIR) filtering, infinite impulse response (IIR) filtering, image processing, modulation (e.g., equalization, etc.), encryption, error correction, etc. The DSP blocks may offer other functionality such as accumulation, addition/subtraction, summation, etc.

PLD 1000 may include a plurality of input/output elements (IOEs). Each IOE may include at least one input buffer and/or at least one output buffer coupled to one or more pins of the PLD, where the pins may be external terminals separate from the die of the PLD. In one embodiment, an IOE may be used to communicate input signals, output signals, supply voltages, etc. between other components of the PLD and one or more external devices (e.g., separate form the PLD). In one embodiment, the IOEs may be located at end of the rows and columns of the LABs around the periphery of PLD 1000 (e.g., in column 1051, in row 1052, etc.).

In one embodiment, PLD 1000 may include routing resources. For example, PLD 1000 may include LAB local interconnect lines, row interconnect lines (e.g., "H-type wires"), column interconnect lines (e.g., "V-type wires"), etc. that may be used to route signals between components of PLD 1000.

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A communication circuit, comprising:
    a transmitter of a first device, wherein said transmitter comprises:
        a first PCS transmit module operating at a first data rate;
        a second PCS transmit module operating at a second data rate;
        a plurality of forward error correction (FEC) encoding modules, each operating at a specified data rate, wherein one or more FEC encoding modules are configurable to support said first PCS module and said second PCS module;
    a receiver of said first device comprising a plurality of PCS receive modules, wherein said receiver is configured for receiving packets of information over one or more channels from a second device operating at one of said first and second data rates, wherein said receiver comprises a plurality of FEC decoding modules, each operating at said specified data rate, wherein said plurality of FEC decoding modules is configured to receive said packets of information from said second device;
    a BER state machine in a PCS receive module of said receiver for determining a high bit error rate when discovering a predetermined number of errored SYNC blocks out of a 125 microsecond window from said packets of information.

2. The communication circuit of claim 1, wherein said receiver further comprises:
    a SYNC state machine in said PCS receive module for determining a corresponding channel is in lock when discovering a predetermined number of non-errored SYNC blocks in a row from a corresponding FEC decoding module, and wherein said block lock module is for determining said corresponding channel is out-oflock when discovering a predetermined number of errored SYNC blocks out of 64 SYNC blocks.

3. The communication circuit of claim 1, wherein said specified data rate is approximately 10 gigabits per second.

4. The communication circuit of claim 3, wherein said first data rate is approximately 10 gigabits per second, and wherein said second data rate is approximately 40 gigabits per second.

5. The communication circuit of claim 1, further comprising:
a backplane configured for Ethernet communication, wherein said backplane facilitates communication for said first device and said second device.

6. The communication circuit of claim 1, further comprising:
an FPGA logic chip comprising components of said first device.

7. A method for operating a communication circuit, comprising:
at a first PCS transmit module of a transmitter of a first device, providing a stream of information arranged in packets at a first data rate;
at said first PCS transmit module, striping said stream of information into one or more substreams of information delivered over one or more channels, wherein each of said channels operate at a second data rate equal to or lower than said first data rate;
at said first PCS transmit module, periodically adding an alignment marker to each substream of information; and
performing forward error correction (FEC) on each substream, wherein one or more FEC encoding modules of a plurality of FEC encoding modules are configured to support said first PCS transmit module, wherein each of said plurality of FEC modules operate at approximately said second data rate;
providing a second PCS transmit module at said transmitter, wherein said second PCS transmit module operates at a third data rate greater than said second data rate, and wherein one or more of said plurality of FEC modules are configurable to support said second PCS transmit module operating at said third data rate;
at a receiver of said first device, configuring a plurality of FEC decoding modules to receive one or more substreams of information transmitted from a second device operating at said second data rates;
at each of said one or more FEC decoding modules, performing error correction;
at an alignment module of said receiver, performing block alignment on said one or more substreams of information; and
at a deskew module of said receiver, performing deskew between on said one or more substreams of information received by said receiver.

8. The method of claim 7, further comprising:
at a FEC decoding module, marking SYNC bits in a block of a packet with an error value when detecting a fatal error.

9. The method of claim 8, further comprising:
marking SYNC bits every other block in said FEC decoding module with an error value.

10. The method of claim 8, further comprising:
marking every block in said FEC decoding module with an error value.

11. The method of claim 7, further comprising:
at SYNC state machine of said receiver, determining a lane is in lock when discovering a predetermined number of non-errored SYNC blocks in a row from a corresponding FEC decoding module; and
at said SYNC state machine, determining a lane is out-of-lock when discovering a predetermined number of errored SYNC blocks out of 64 SYNC blocks.

12. The method of claim 7, further comprising:
at a BER state machine of said receiver, determining a high bit error rate when discovering a predetermined number of errored SYNC blocks out of a 125 microsecond window.

13. The method of claim 7, wherein said first data rate is approximately 40 gigabits per second; and wherein said second data rate is approximately 10 gigabits per second.

14. The method of claim 7, wherein each of said first and second data rates is approximately 10 gigabits per second.

15. A communication circuit, comprising:
a receiver of a first device for receiving packets of information over one or more channels corresponding to a selected first or second PCS module from a transmitter of a second device, wherein said first PCS module operates at a first data rate of approximately 10 gigabits per second, and wherein said second PCS module operates at a second data rate of approximately 40 gigabits per second;
wherein said receiver comprises a plurality of FEC decoding modules, each operating at said specified data rate of approximately 10 gigabits per second, wherein one or more FEC decoding modules are configured to receive said packets of information from one or more FEC encoding modules of said transmitter of said second device over said one or more channels; and
wherein said receiver comprises a BER state machine in a PCS receive module for determining a high bit error rate when discovering a predetermined number of errored SYNC blocks out of a 125 microsecond window from said packets of information.

* * * * *